(12) United States Patent
Jeon et al.

(10) Patent No.: US 12,279,436 B2
(45) Date of Patent: Apr. 15, 2025

(54) NON-VOLATILE MEMORY INCLUDING NEGATIVE CAPACITANCE BLOCKING OXIDE LAYER, OPERATING METHOD OF THE SAME AND MANUFACTURING METHOD OF THE SAME

(71) Applicant: Korea Advanced Institute of Science and Technology, Daejeon (KR)

(72) Inventors: Sanghun Jeon, Daejeon (KR); Taeho Kim, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 117 days.

(21) Appl. No.: 18/197,189

(22) Filed: May 15, 2023

(65) Prior Publication Data

US 2023/0413574 A1    Dec. 21, 2023

(30) Foreign Application Priority Data

May 13, 2022    (KR) .................... 10-2022-0059004

(51) Int. Cl.
*H10B 51/30* (2023.01)
*G11C 11/22* (2006.01)
*H10B 51/20* (2023.01)

(52) U.S. Cl.
CPC ............ *H10B 51/30* (2023.02); *G11C 11/223* (2013.01); *G11C 11/2275* (2013.01); *H10B 51/20* (2023.02)

(58) Field of Classification Search
CPC ........ H10B 51/30; H10B 51/20; H10B 43/30; H10B 43/27; G11C 11/223; G11C 11/2275; G11C 16/0483; G11C 16/0466; G11C 16/10; G11C 16/26; H01L 29/516; H01L 29/40111; H01L 29/40117; H01L 29/78391; H10D 30/701; H10D 64/033; H10D 64/037; H10D 64/689
USPC ...................................................... 365/145
See application file for complete search history.

(56) References Cited

U.S. PATENT DOCUMENTS 10,210,921 B1 *   2/2019   Hwang ............... G11C 11/2259
11,430,812 B2 *   8/2022   Lee ........................ H10B 51/30

FOREIGN PATENT DOCUMENTS

KR    1020210015148    2/2021

\* cited by examiner

*Primary Examiner* — Fernando Hidalgo
(74) *Attorney, Agent, or Firm* — Verrill Dana, LLP

(57) ABSTRACT

Disclosed are a non-volatile memory including a negative capacitance blocking oxide layer, an operating method of the same, and a manufacturing method of the same. The non-volatile memory may include a tunneling oxide layer formed on a channel; a charge storage layer formed on one surface of the tunneling oxide layer; a negative capacitance blocking oxide layer in which a dielectric layer and an imprinted polarization layer are sequentially configured on one surface of the charge storage layer; and a gate formed on one surface of the negative capacitance blocking oxide layer.

14 Claims, 15 Drawing Sheets

110 – 120 – 130 – 140(141 – 142) – 150

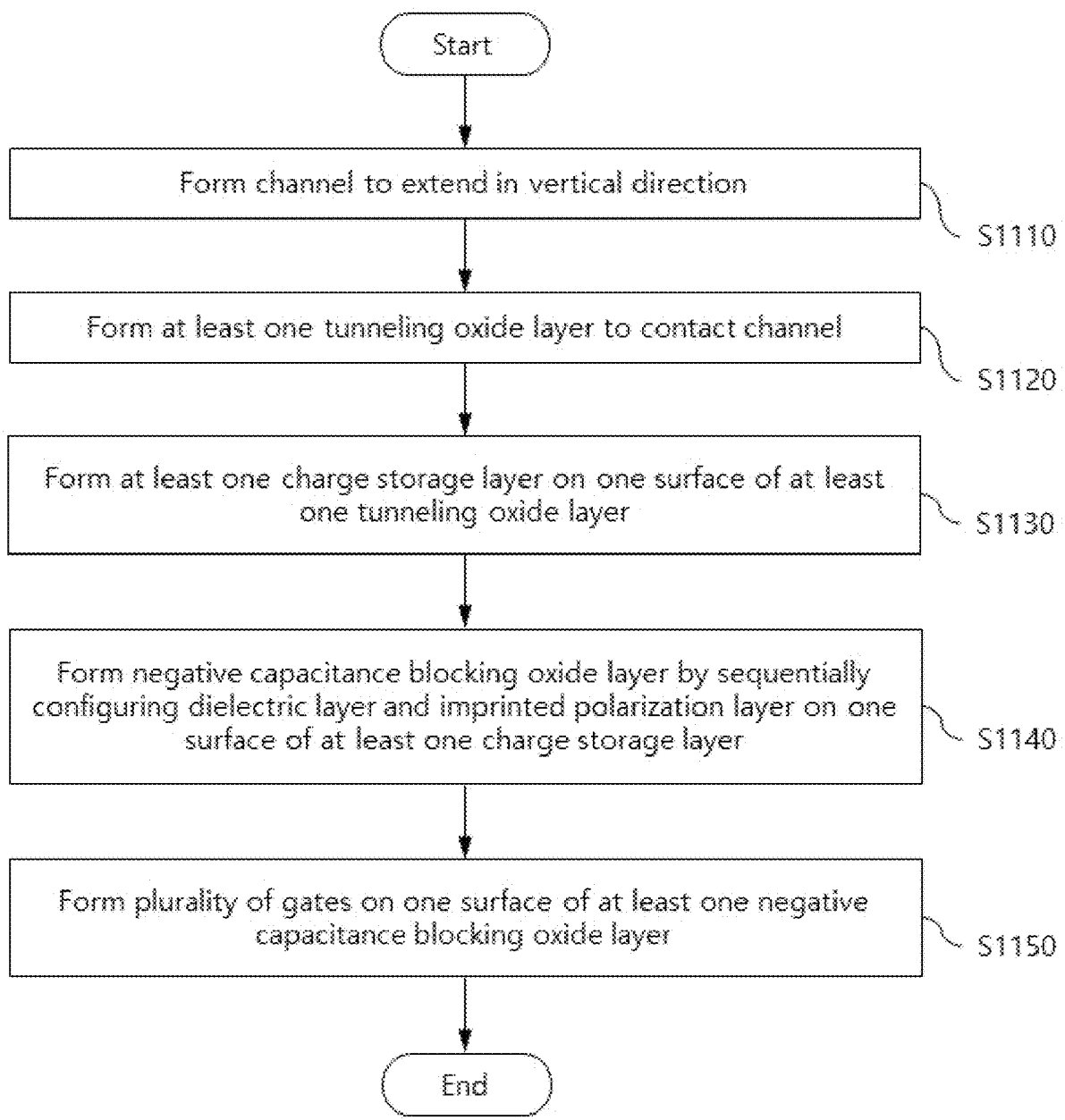

NON-VOLATILE MEMORY INCLUDING NEGATIVE CAPACITANCE BLOCKING OXIDE LAYER, OPERATING METHOD OF THE SAME AND MANUFACTURING METHOD OF THE SAME

CROSS-REFERENCE TO RELATED APPLICATION(S)

This application claims the priority benefit of Korean Patent Application No. 10-2022-0059004, filed on May 13, 2022, in the Korean Intellectual Property Office, the disclosure of which is incorporated herein by reference.

BACKGROUND

1. Field of the Invention

Example embodiments relate to a non-volatile memory, and more particularly, to technology for a non-volatile memory including a blocking oxide layer having a negative capacitance.

2. Description of the Related Art

A non-volatile memory refers to a memory that electrically controls input and output of data and may store information even after power is lost.

Research and development of such non-volatile memory is being conducted with fast operating speed, low operating voltage, and good durability as major issues.

However, the conventional non-volatile memory has slow operating speed, high operating voltage, and degraded durability since electrons frequently move through a tunneling oxide layer during a program operation, a read operation, and an erase operation.

Accordingly, although technology using a single-layered high-k insulating film as a blocking oxide layer is proposed, durability may be degraded due to an increase in leakage current by a low band gap characteristic of the high-k insulating film.

Therefore, there is a need for technology for solving issues found in the conventional non-volatile memory and the non-volatile memory using the single-layered high-k insulating film as the blocking oxide layer.

SUMMARY

Example embodiments provide a non-volatile memory including a negative capacitance blocking oxide layer configured with a dielectric layer and an imprinted polarization layer to improve operating voltage and operating speed without degrading durability, an operating method of the same, and a manufacturing method of the same.

In detail, example embodiments provide a non-volatile memory that may allow an imprinted polarization layer to have a negative capacitance by a depolarization field induced in response to a positive voltage being applied to a gate, may additionally induce an internal field by the depolarization field of the imprinted polarization layer in the dielectric layer, and may charge and boost a negative capacitance blocking oxide layer based on the depolarization field and the internal field, an operating method of the same, and a manufacturing method of the same.

However, technical objects to be achieved by the present disclosure are not limited to the aforementioned objects and may variously expand without departing from the technical spirit and scope of the present disclosure.

According to an example embodiment, there is provided a non-volatile memory including a tunneling oxide layer formed on a channel; a charge storage layer formed on one surface of the tunneling oxide layer; a negative capacitance blocking oxide layer in which a dielectric layer and an imprinted polarization layer are sequentially configured on one surface of the charge storage layer; and a gate formed on one surface of the negative capacitance blocking oxide layer.

According to an aspect, the imprinted polarization layer may have a negative capacitance by a depolarization field induced as an initially aligned polarization is switched in response to a positive voltage being applied to the gate, the depolarization field being in a direction opposite to that of an electric field of the switched polarization.

According to another aspect, the negative capacitance blocking oxide layer may have a capacitance based on an internal field additionally induced in the dielectric layer by the depolarization field of the imprinted polarization layer and the depolarization field of the imprinted polarization layer, the internal field being in a direction opposite to that of the depolarization field.

According to still another aspect, an electric field applied to the tunneling oxide layer may be amplified as the negative capacitance blocking oxide layer has a capacitance based on the internal field of the dielectric layer and the depolarization field of the imprinted polarization layer.

According to still another aspect, the positive voltage applied to the gate may have a short pulse width that prevents compensation charge of the switched polarization from being injected into the imprinted polarization layer.

According to still another aspect, an imprinted ferroelectric layer or an imprinted antiferroelectric layer may be used as the imprinted polarization layer.

According to still another aspect, the imprinted polarization layer may have an initially aligned polarization in one direction to switch a polarization as a positive voltage is applied to the gate.

According to an example embodiment, there is provided an operating method of a non-volatile memory comprising a tunneling oxide layer formed on a channel; a charge storage layer formed on one surface of the tunneling oxide layer; a negative capacitance blocking oxide layer in which a dielectric layer and an imprinted polarization layer are sequentially configured on one surface of the charge storage layer; and a gate formed on one surface of the negative capacitance blocking oxide layer, the operating method including applying a positive voltage to the gate; switching an initially aligned polarization of the imprinted polarization layer in response to the positive voltage being applied to the gate; inducing a depolarization field that is in a direction opposite to that of an electric field of the switched polarization in the imprinted polarization layer as the initially aligned polarization of the imprinted polarization layer is switched; additionally inducing an internal field that is in a direction opposite to that of the depolarization field in the dielectric layer by the depolarization field of the imprinted polarization layer; and charging and boosting the negative capacitance blocking oxide layer based on the depolarization field of the imprinted polarization layer and the internal field of the dielectric layer.

According to an aspect, the charging and the boosting may include amplifying an electric field applied to the tunneling oxide layer as the negative capacitance blocking oxide layer has a capacitance based on the depolarization field of the imprinted polarization layer and the internal field of the dielectric layer.

According to an example embodiment, there is provided a manufacturing method of a non-volatile memory, the manufacturing method including forming a tunneling oxide layer on a channel; forming a charge storage layer on one surface of the tunneling oxide layer; forming a negative capacitance blocking oxide layer by sequentially configuring a dielectric layer and an imprinted polarization layer on one surface of the charge storage layer; and forming a gate on one surface of the negative capacitance blocking oxide layer.

According to an aspect, the forming of the negative capacitance blocking oxide layer may include forming the imprinted polarization layer having an initially aligned polarization in one direction to switch a polarization as a positive voltage is applied to the gate.

According to an example embodiment, there is provided a non-volatile memory in a three-dimensional (3D) structure, the non-volatile memory including a channel formed to extend in a vertical direction; at least one tunneling oxide layer formed to contact the channel; at least one charge storage layer formed to contact the at least one tunneling oxide layer; at least one negative capacitance blocking oxide layer in which a dielectric layer and an imprinted polarization layer are sequentially configured to contact the at least one charge storage layer; and a plurality of gates formed to contact the at least one negative capacitance blocking oxide layer.

According to an aspect, the imprinted polarization layer may have a negative capacitance by a depolarization field induced as an initially aligned polarization is switched in response to a positive voltage being applied to the gate, the depolarization field being in a direction opposite to that of an electric field of the switched polarization.

According to another aspect, the at least one negative capacitance blocking oxide layer may have a capacitance based on an internal field additionally induced in the dielectric layer by the depolarization field of the imprinted polarization layer and the depolarization field of the imprinted polarization layer, the internal field being in a direction opposite to that of the depolarization field.

According to still another aspect, an electric field applied to the tunneling oxide layer may be amplified as the at least one negative capacitance blocking oxide layer has a capacitance based on the internal field of the dielectric layer and the depolarization field of the imprinted polarization layer.

According to still another aspect, an imprinted ferroelectric layer or an imprinted antiferroelectric layer may be used as the imprinted polarization layer.

According to an example embodiment, there is provided an operating method of a non-volatile memory in a 3D structure including a channel formed to extend in a vertical direction; at least one tunneling oxide layer formed to contact the channel; at least one charge storage layer formed to contact the at least one tunneling oxide layer; at least one negative capacitance blocking oxide layer in which a dielectric layer and an imprinted polarization layer are sequentially configured to contact the at least one charge storage layer; and a plurality of gates formed to contact the at least one negative capacitance blocking oxide layer, the operating method including applying a positive voltage to one gate among the plurality of gates; switching an initially aligned polarization of the imprinted polarization layer corresponding to the one gate in response to the positive voltage being applied to the one gate; inducing a depolarization field that is in a direction opposite to that of an electric field of the switched polarization in the imprinted polarization layer as the initially aligned polarization of the imprinted polarization layer is switched; additionally inducing an internal field that is in a direction opposite to that of the depolarization field in the dielectric layer by the depolarization field of the imprinted polarization layer; and charging and boosting the at least one negative capacitance blocking oxide layer based on the depolarization field of the imprinted polarization layer and the internal field of the dielectric layer.

According to an aspect, the charging and the boosting may include amplifying an electric field applied to the at least one tunneling oxide layer as the at least one negative capacitance blocking oxide layer has a capacitance based on the depolarization field of the imprinted polarization layer and the internal field of the dielectric layer.

According to an example embodiment, there is provided a manufacturing method of a non-volatile memory in a 3D structure, the manufacturing method including forming a channel to extend in a vertical direction; forming at least one tunneling oxide layer to contact the channel; forming at least one charge storage layer to contact the at least one tunneling oxide layer; forming at least one negative capacitance blocking oxide layer by sequentially configuring a dielectric layer and an imprinted polarization layer to contact the at least one charge storage layer; and forming a plurality of gates to contact the at least one negative capacitance blocking oxide layer.

According to an aspect, the forming of the at least one negative capacitance blocking oxide layer may include forming the imprinted polarization layer having an initially aligned polarization in one direction to switch a polarization of the imprinted polarization layer corresponding to one gate as a positive voltage is applied to the one gate among the plurality of gates.

According to some example embodiments, it is possible to provide a non-volatile memory including a negative capacitance blocking oxide layer configured with a dielectric layer and an imprinted polarization layer, an operating method of the same, and a manufacturing method of the same.

In detail, according to some example embodiments, it is possible to provide a non-volatile memory that may allow an imprinted polarization layer to have a negative capacitance by a depolarization field induced in response to a positive voltage being applied to a gate, may additionally induce an internal field by the depolarization field of the imprinted polarization layer in the dielectric layer, and may charge and boost a negative capacitance blocking oxide layer based on the depolarization field and the internal field, an operating method of the same, and a manufacturing method of the same.

Therefore, a non-volatile memory, an operating method of the same, and a manufacturing method of the same according to an example embodiment may achieve the technical effects that may improve operating voltage and operating speed without degrading durability.

However, effects of the present disclosure are not limited to the aforementioned effects and may variously expand without departing from the technical spirit and scope of the present disclosure.

BRIEF DESCRIPTION OF THE DRAWINGS

These and/or other aspects, features, and advantages of the invention will become apparent and more readily appreciated from the following description of embodiments, taken in conjunction with the accompanying drawings of which:

FIG. 11 is a flowchart illustrating a manufacturing method of the non-volatile memory in the 3D structure of FIG. 9.

DETAILED DESCRIPTION

Figure 1:
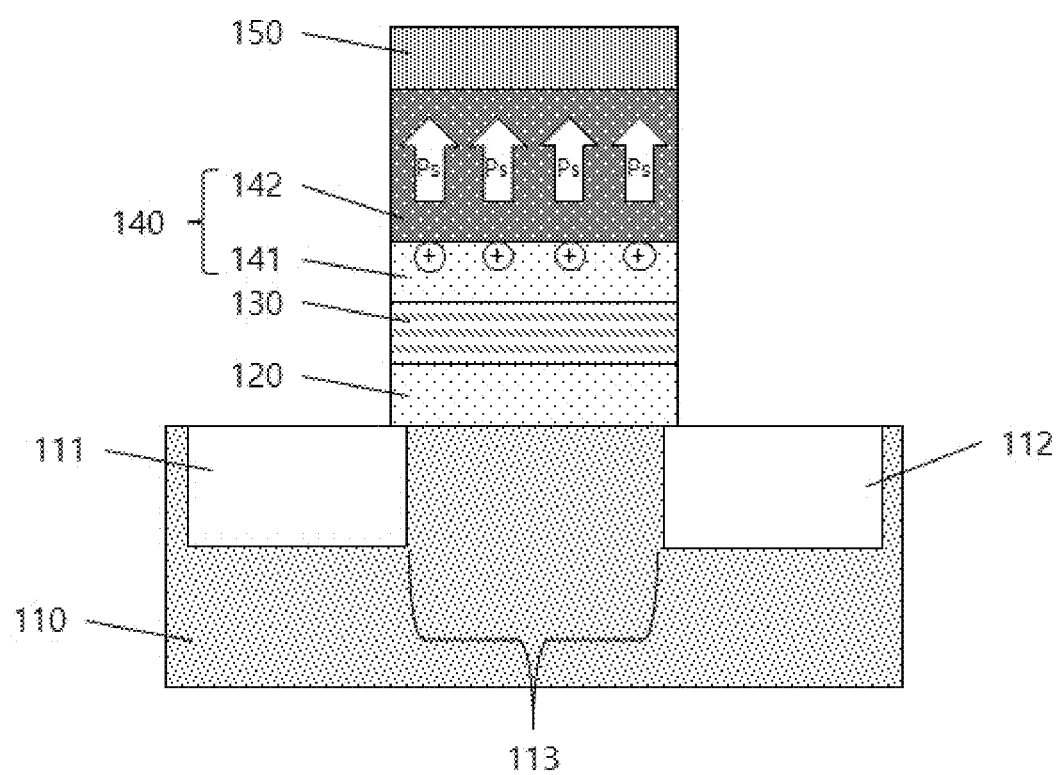
FIG. 1 is a cross-sectional view illustrating a non-volatile memory according to an example embodiment.

Hereinafter, example embodiments will be described in detail with reference to the accompanying drawings. However, the present disclosure is not limited to or restricted by the example embodiments. Also, like reference numerals refer to like elements throughout.

Also, terms (terminology) used herein refer to terms used to appropriately express the example embodiments and may vary according to the intent of a viewer, an operator, or customs in the field to which the present disclosure pertains. Therefore, the terms need to be defined based on the overall contents of the present specification. For example, in the present specification, singular forms include plural forms unless clearly stated otherwise. Also, "comprises" and/or "comprising" used herein specifies the presence of stated components, steps, operations and/or elements, and does not preclude presence or addition of one or more other components, steps, operations and/or elements. Also, although terms, such as first and second, are used herein to describe various regions, directions, shapes, and the like, such regions, directions, and shapes should not be limited by the terms. The terms are simply used to distinguish one region, direction, or shape from another region, direction, or shape. Therefore, a portion referred to as a first portion in one example embodiment may be referred to as a second portion in another example embodiment.

Also, it should be understood that various example embodiments differ from each other but do not need to be mutually exclusive. For example, a specific shape, structure, and feature described herein may be implemented in another example embodiment without departing from the technical spirit and scope of the present disclosure in association with an example embodiment. Also, it should be understood that a location, an arrangement, or a configuration of an individual component in the scope of each example embodiment may be changed without departing from the technical spirit and scope of the present disclosure.

Hereinafter, a three-dimensional (3D) non-volatile memory, an operating method of the same, and a manufacturing method of the same according to example embodiments will be described with reference to the accompanying drawings. The following 3D non-volatile memory may improve operating speed and durability through a structure that satisfies a condition that a capacitance of a ferroelectric layer is smaller than a capacitance of a dielectric layer based on a bitline metal-ferroelectric-barrier metal-insulator-wordline metal (MFMIM) structure. Also, the 3D non-volatile memory may omit a separate diode or selector through a structure that includes a charge-fixed layer in which a self-rectification function is implemented by forming an imprint field and accordingly, may improve integration.

Figure 2A:
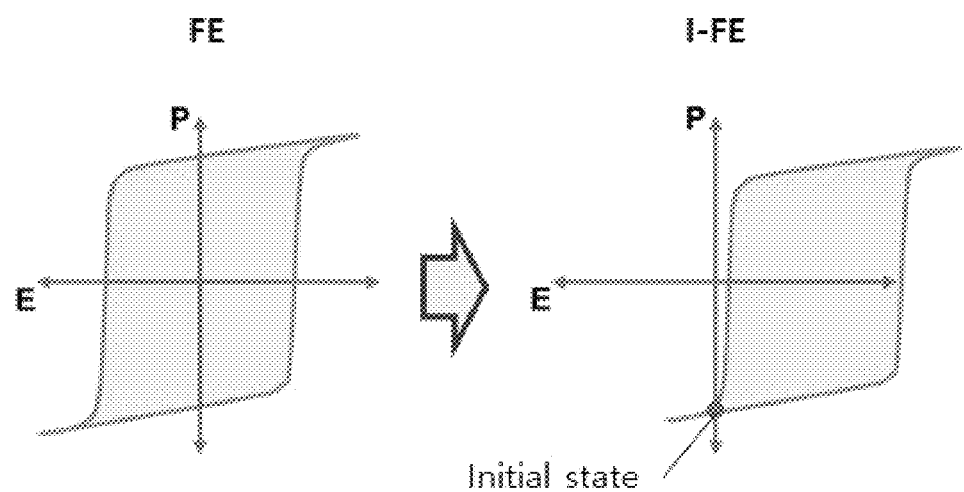
FIGS. 2A and 2B illustrate an example in which an imprinted polarization layer included in a negative capacitance blocking oxide layer has an initially aligned polarization in the non-volatile memory of FIG. 1.
Figure 2B:
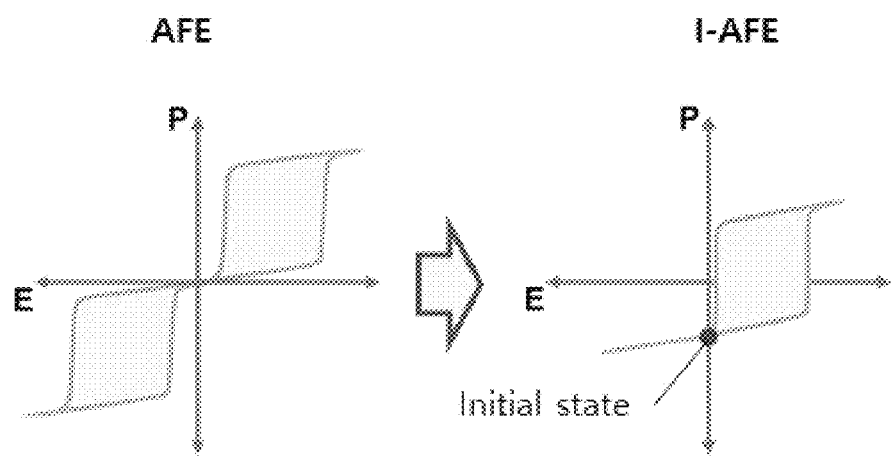
Figure 3A:
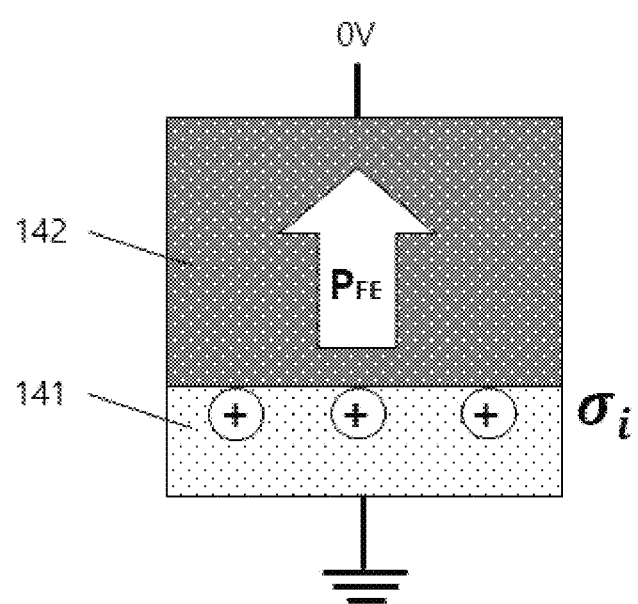
FIGS. 3A and 3B are cross-sectional views of the non-volatile memory to explain that a negative capacitance blocking oxide layer is charged and boosted in the non-volatile memory of FIG. 1.
Figure 3B:
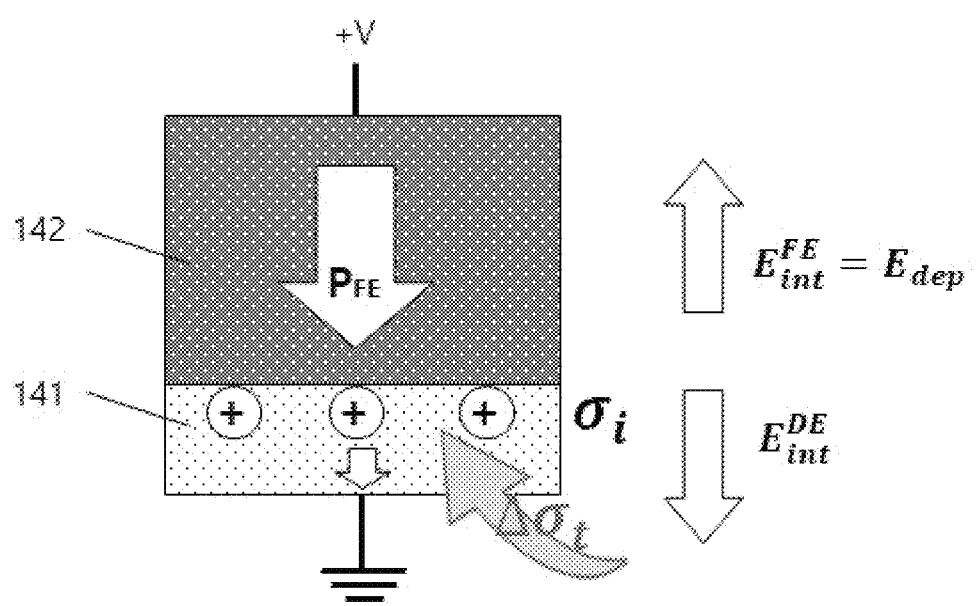
Figure 4A:
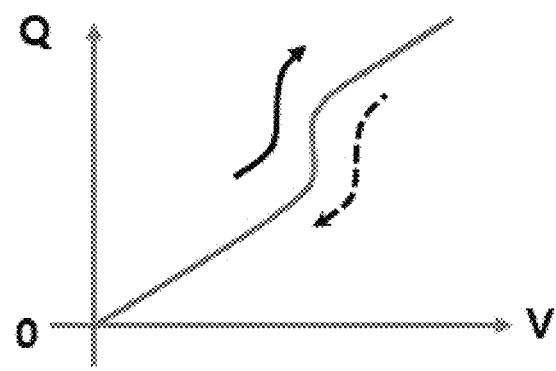
FIGS. 4A and 4B are graphs explaining that a negative capacitance blocking oxide layer has a greater capacitance than an external field in the non-volatile memory of FIG. 1.
Figure 4B:
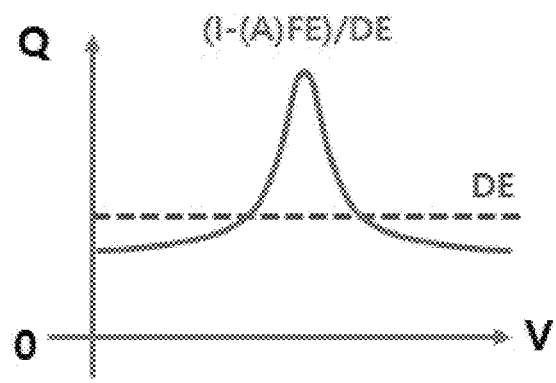
Figure 5:
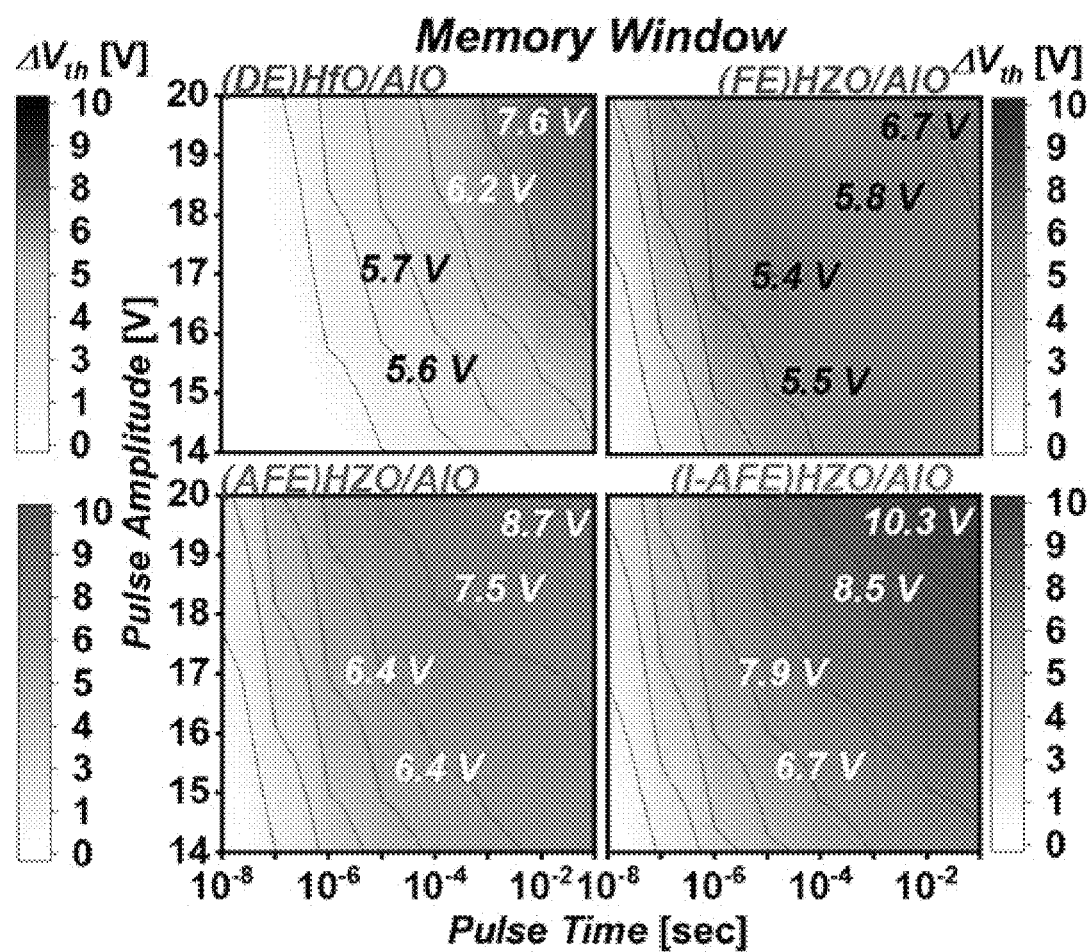
FIG. 5 illustrates an example of explaining technical effects achieved by the non-volatile memory of FIG. 1 compared to a conventional non-volatile memory.
Figure 6A:
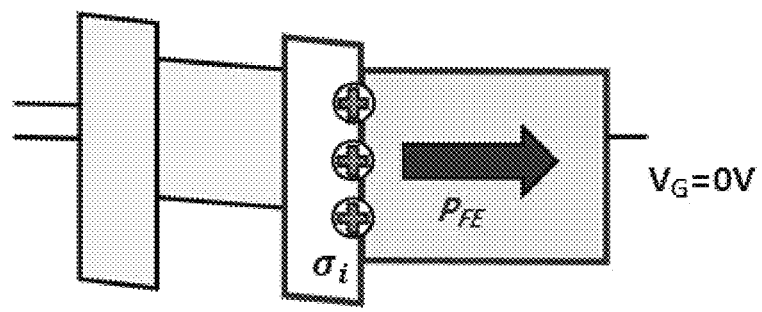
FIGS. 6A and 6B are energy band diagrams explaining that a negative capacitance blocking oxide layer is charged and boosted in the non-volatile memory of FIG. 1.
Figure 6B:
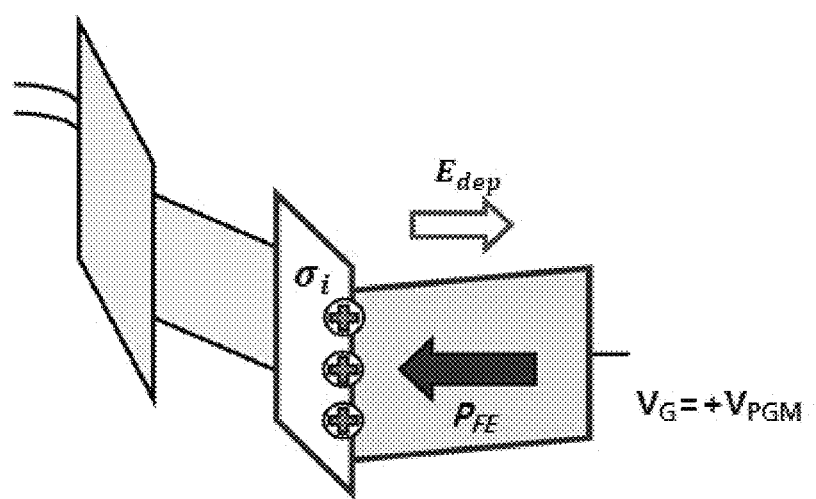

FIG. 1 is a cross-sectional view illustrating a non-volatile memory according to an example embodiment, FIGS. 2A and 2B illustrate an example in which an imprinted polarization layer included in a negative capacitance blocking oxide layer has an initially aligned polarization in the non-volatile memory of FIG. 1, FIGS. 3A and 3B are cross-sectional views of the non-volatile memory to explain that a negative capacitance blocking oxide layer is charged and boosted in the non-volatile memory of FIG. 1, FIGS. 4A and 4B are graphs explaining that a negative capacitance blocking oxide layer has a greater capacitance than an external field in the non-volatile memory of FIG. 1, FIG. 5 illustrates an example of explaining technical effects achieved by the non-volatile memory of FIG. 1 compared to a conventional non-volatile memory, and FIGS. 6A and 6B are energy band diagrams explaining that a negative capacitance blocking oxide layer is charged and boosted in the non-volatile memory of FIG. 1.

Referring to FIG. 1, a non-volatile memory according to an example embodiment may include a semiconductor substrate 110, a first impurity region 111 and a second impurity region 112 formed on both sides of one surface of the semiconductor substrate 110, respectively, a channel 113 formed between the first impurity region 111 and the second impurity region 112, a tunneling oxide layer 120 formed on the channel 113, a charge storage layer 130 formed on one surface of the tunneling oxide layer 120, a negative capacitance blocking oxide layer 140 formed on one surface of the charge storage layer 130, and a gate 150 formed on one surface of the negative capacitance blocking oxide layer 140.

The above structure corresponds to a two-dimensional (2D) structure and the non-volatile memory is not limited to or restricted by the above 2D structure and may be formed in various structures on the premise of necessarily including the tunneling oxide layer 120 formed on the channel 113, the charge storage layer 130 formed on one surface of the tunneling oxide layer 120, the negative capacitance blocking oxide layer 140 formed on one surface of the charge storage layer 130, and the gate 150 formed on one surface of the negative capacitance blocking oxide layer 140. For example, as the channel 113 is formed to extend in a vertical direction, the non-volatile memory may be implemented in a three-dimensional (3D) structure in which the tunneling oxide layer 120, the charge storage layer 130, the negative capacitance blocking oxide layer 140, and the gate 150 are connected to the channel 113 in a horizontal direction. Further description related thereto is made with reference to FIG. 9.

The substrate 110 may be a semiconductor substrate, for example, a monocrystalline epitaxial layer grown on a silicon substrate, a silicon-germanium substrate, a germanium substrate, or a monocrystalline silicon substrate.

The first impurity region 111 and the second impurity region 112 may correspond to a source and a drain, respectively.

The tunneling oxide layer 120 refers to a layer that F-N tunnels charge of the channel 113 to the charge storage layer 130 by an applied electric field, and may be formed of oxide, such as SiO, AlO, TiO, and the like.

The charge storage layer 130 refers to a layer that serves as a data storage by implementing data values by trapping charge tunneled through the tunneling oxide layer 120 and may be formed of nitride, such as SiN.

The negative capacitance blocking oxide layer 140 refers to a layer that serves as a shield. In particular, in an example embodiment, the negative capacitance blocking oxide layer 140 may serve as a shield and may also serve to improve operating voltage and operating speed without degrading durability through charging and boosting of charge.

To this end, the negative capacitance blocking oxide layer 140 may have a dual structure in which a dielectric layer 141 and an imprinted polarization layer 142 are sequentially configured on one surface of the charge storage layer 130.

The imprinted polarization layer 142 may be switched at a voltage of an opposite polarity of an aligned initial polarization since an imprinted ferroelectric layer (Imprinted Ferroelectrics; I-FE) or an imprinted antiferroelectric layer (Imprinted Antiferroelectric; I-AFE) is used to have the initially aligned polarization. Therefore, the imprinted polarization layer 142 may implement a self-rectification function. For example, the imprinted polarization layer 142 may be formed in such a manner that ferroelectric, such as Pb (Zr, Ti) O, is imprinted as illustrated in FIG. 2A, or may be formed in such a manner that antiferroelectric, such as HfZrO, is imprinted as illustrated in FIG. 2B, to have the initially aligned polarization in one direction (e.g., negative direction) such that a polarization may be switched as a positive voltage is applied to the gate 150.

The dielectric layer (Dielectric; DE) 141 may be formed of oxide, such as SiO, AlO, and TiO, to tunnel compensation charge for the switched polarization of the imprinted polarization layer 142.

The gate 150 refers to a component to which a voltage is applied to generate an electric field in the tunneling oxide layer 120 and may be formed of a conductive material that includes at least one selected from among a doped semiconductor (e.g., doped silicon, etc.), metal (e.g., tungsten (W), copper (Cu), aluminum (Al), titanium (Ti), tantalum (Ta), molybdenum (Mo), ruthenium (Ru), gold (Au), etc.), and conductive metal nitride (e.g., titanium nitride, tantalum nitride, etc.).

In the negative capacitance blocking oxide layer 140 in the above structure, as illustrated in FIG. 3A, interfacial charge (or fixed charge) ($\sigma_i$) is present in an interface with the dielectric layer 141 to stabilize an initially aligned polarization ($P_{FE}$) of the imprinted polarization layer 142. As illustrated in FIG. 3B, when a positive voltage (+V) having a shorter pulse width of less than a preset value (e.g., a pulse width of less than 1 μs) is applied to the gate 150, the initially aligned polarization of the imprinted polarization layer 142 may be switched. On the contrary, since the pulse width of the positive voltage is too short to inject compensation charge ($\Delta\sigma_t$) into the imprinted polarization layer 142, the compensation charge for the switched polarization may be tunneled through the dielectric layer 141 and not injected into the imprinted polarization layer 142. Therefore, interfacial charge (or fixed charge) may be maintained.

In the imprinted polarization layer 142 that is not compensated by the compensation charge, a depolarization field ($E_{dep}$) in an opposite direction to that of an electric field of the initially aligned polarization may be induced as the initially aligned polarization of the imprinted polarization layer 142 is switched. Therefore, the imprinted polarization layer 142 may have a negative capacitance by the depolarization field.

The depolarization field induced in the imprinted polarization layer 142 may destabilize hysteresis of the imprinted polarization layer 142 and an internal field ($E_{int}^{DE}$) in an opposite direction to that of the depolarization field may be additionally induced in the dielectric layer 141 that is in contact with the imprinted polarization layer 142.

Therefore, referring to FIGS. 4A and 4B, the negative capacitance blocking oxide layer 140 may have a greater capacitance value than an external field based on the depolarization field of the imprinted polarization layer 142 and the internal field of the dielectric layer 141 and may be charged and boosted. In particular, the negative capacitance blocking oxide layer 140 may have an increased capacitance compared to an existing structure configured with only a single dielectric layer.

As described above, as the negative capacitance blocking oxide layer 140 has a capacitance based on the depolarization field of the imprinted polarization layer 142 and the internal field of the dielectric layer 141, the electric field applied to the tunneling oxide layer 120 may be amplified and the non-volatile memory may achieve technical effects of improving operating voltage and operating speed without degrading durability. For example, referring to FIG. 5, the non-volatile memory in the aforementioned structure may improve all of the operating voltage and the operating speed compared to the non-volatile memory in the existing structure.

In this regard, describing with reference to energy band diagrams, if a ground voltage, 0V, is applied to the gate 150, a band diagram appears as illustrated in FIG. 6A. On the contrary, if a positive voltage, $+V_{PGM}$, is applied to the gate 150, the electric field applied to the tunneling oxide layer 120 may be amplified in such a manner that the imprinted polarization layer 142 band-bends in a direction opposite to $+V_{PGM}$ and is compensated by band-bending of the tunneling oxide layer 120 as illustrated in FIG. 6B.

Hereinafter, an operating method and a manufacturing method of the non-volatile memory in the aforementioned structure are described.

Figure 7:
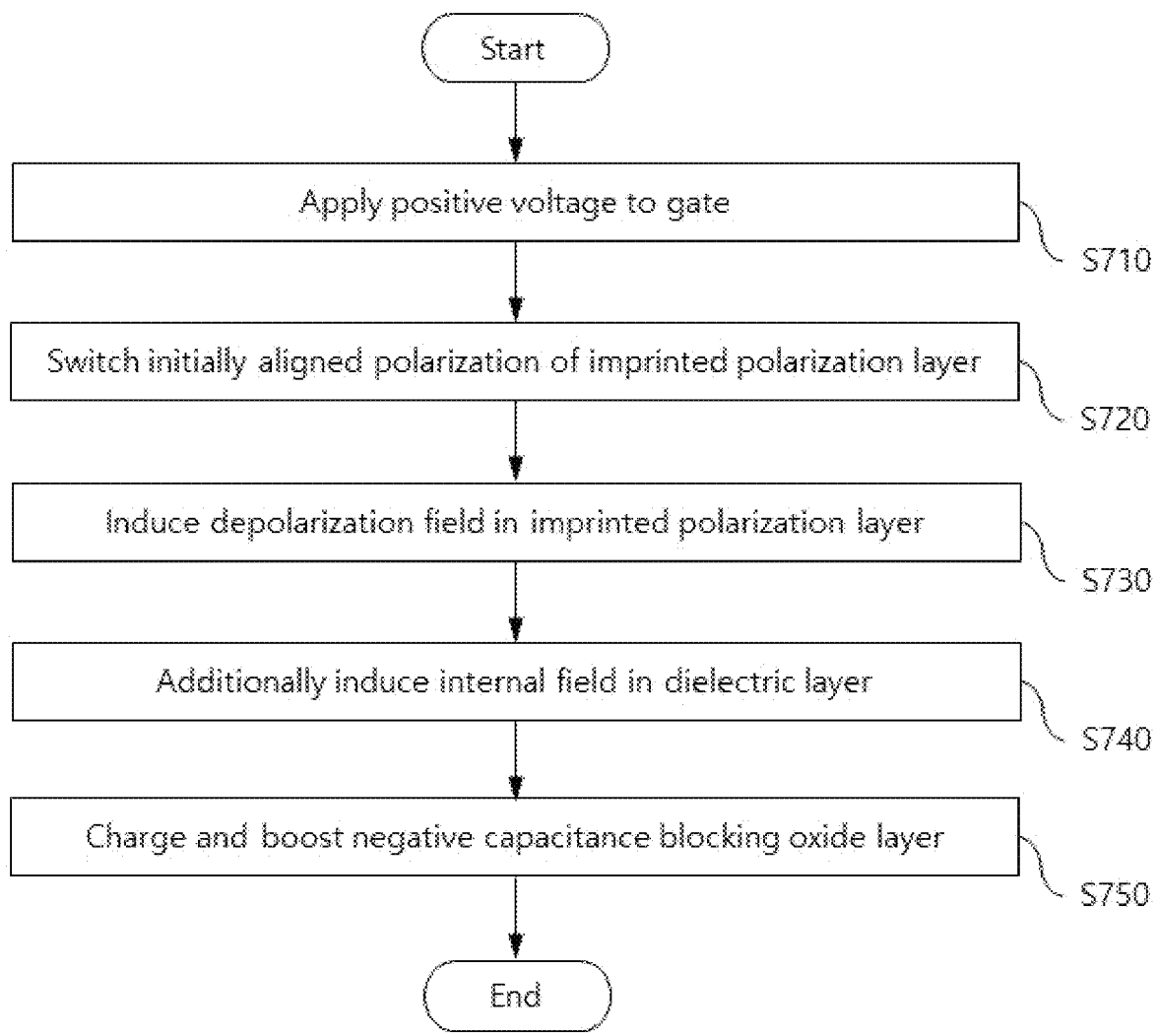
FIG. 7 is a flowchart illustrating an operating method of the non-volatile memory of FIG. 1.

FIG. 7 is a flowchart illustrating an operating method of the non-volatile memory of FIG. 1. In the following operating method, the non-volatile memory described above with reference to FIGS. 1 to 6B operates as a main entity and a program operation among memory operations is described. However, since a process of charging and boosting the negative capacitance blocking oxide layer 140 may be included in other memory operations except for the program operation, the following operating method may also apply to a read operation and an erase operation without being limited to the program operation.

In operation S710, the non-volatile memory may apply a positive voltage to a gate.

In operation S720, the non-volatile memory may switch an initially aligned polarization of an imprinted polarization layer in response to the positive voltage being applied to the gate.

Here, the imprinted polarization layer may be formed to have the initially aligned polarization in one direction to switch a polarization as the positive voltage is applied to the gate. For example, one of an imprinted ferroelectric layer (Imprinted Ferroelectrics; I-FE) and an imprinted antiferroelectric layer (Imprinted Antiferroelectric; I-AFE) may be used as the imprinted polarization layer.

Here, the positive voltage applied to the gate may have a short pulse width to prevent compensation charge of the switched polarization from being injected into the imprinted polarization layer. For example, the positive voltage applied to the gate may have a pulse width of less than 1 μs.

In operation S730, as the initially aligned polarization of the imprinted polarization layer is switched, the non-volatile memory may induce a depolarization field that is in a direction opposite to that of an electric field of the switched polarization in the imprinted polarization layer.

As described above, since the pulse width of the positive voltage is too short to inject the compensation charge into the imprinted polarization layer, the compensation charge for the switched polarization may not be injected into the imprinted polarization layer and accordingly, interfacial charge may be maintained. In the imprinted polarization layer not compensated by the compensation charge, a depolarization field according to switching of the initially aligned polarization may be induced. Therefore, the imprinted polarization layer may have a negative capacitance by the depolarization field.

In operation S740, the non-volatile memory may additionally induce an internal field that is in a direction opposite to that of the depolarization field in the dielectric layer by the depolarization field of the imprinted polarization layer.

In operation S750, the non-volatile memory may charge and boost the negative capacitance blocking oxide layer based on the depolarization field of the imprinted polarization layer and the internal field of the dielectric layer.

In detail, as the depolarization field of the imprinted polarization layer is induced in operation S730 and the internal field of the dielectric layer is additionally induced in operation S740, the negative capacitance blocking oxide layer may have a greater capacitance value than an external field based on the depolarization field of the imprinted polarization layer and the internal field of the dielectric layer and be charged and boosted accordingly in operation S750.

As the negative capacitance blocking oxide layer is charged and boosted (as the negative capacitance blocking oxide layer has a capacitance based on the depolarization field of the imprinted polarization layer and the internal field of the dielectric layer) in operation S750, the non-volatile memory may amplify the electric field that is being applied to the tunneling oxide layer. Therefore, operating voltage and operating speed may be improved without degrading the durability.

Figure 8:
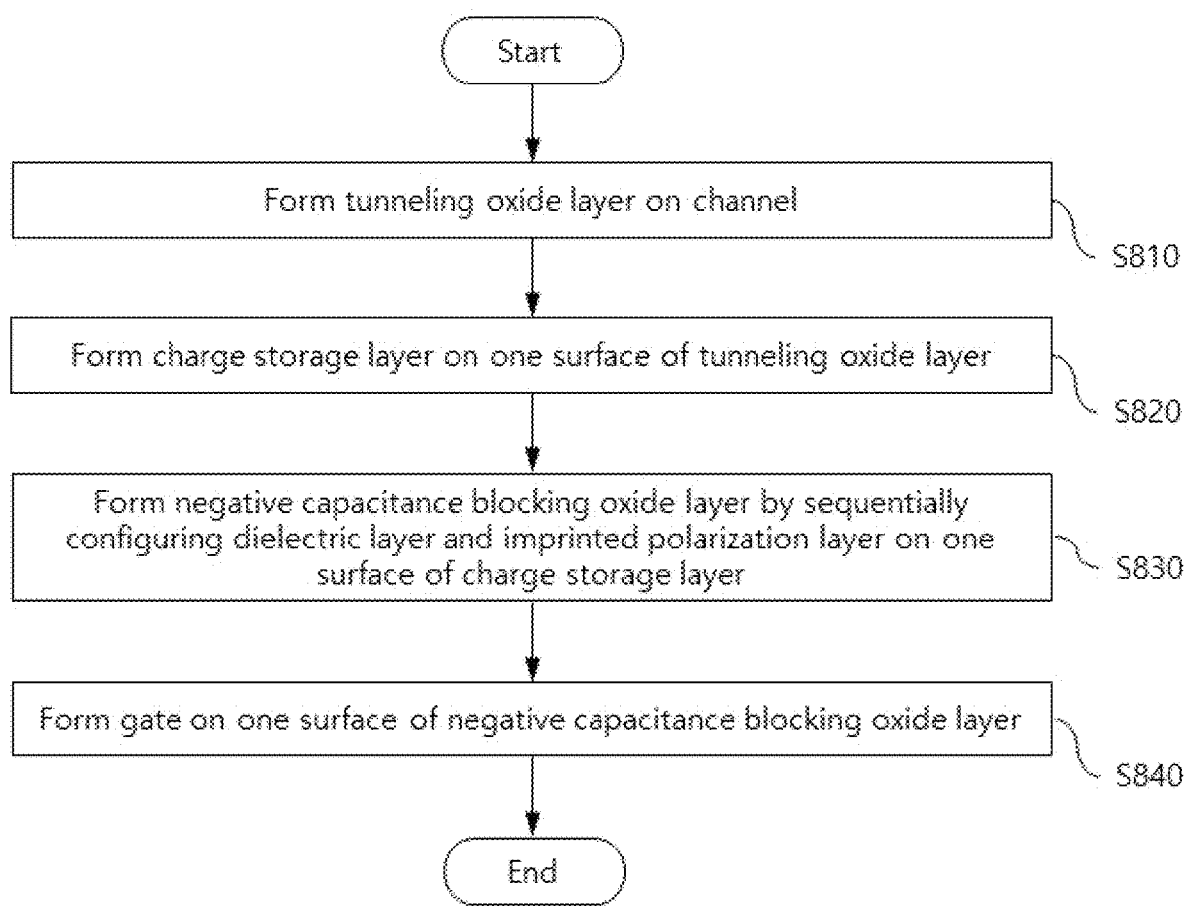
FIG. 8 is a flowchart illustrating a manufacturing method of the non-volatile memory of FIG. 1.

FIG. 8 is a flowchart illustrating a manufacturing method of the non-volatile memory of FIG. 1. The following manufacturing method relates to manufacturing the non-volatile memory described above with reference to FIGS. 1 to 6B and may be premised on being performed by an automated and mechanized manufacturing system.

In operation S810, the manufacturing system may form a tunneling oxide layer on a channel.

In operation S820, the manufacturing system may form a charge storage layer on one surface of the tunneling oxide layer.

In operation S830, the manufacturing system may form a negative capacitance blocking oxide layer by sequentially configuring a dielectric layer and an imprinted polarization layer on one surface of the charge storage layer.

Here, in operation S830, the manufacturing system may form the imprinted polarization layer having an initially aligned polarization in one direction to switch a polarization as a positive voltage is applied to the gate.

Therefore, when the positive voltage is applied to the negative capacitance blocking oxide layer through the gate, the manufactured non-volatile memory may improve operating voltage and operating speed by allowing the imprinted polarization layer to have a negative capacitance by an induced depolarization field, by additionally inducing an internal field by the depolarization field of the imprinted polarization layer in the dielectric layer, and by charging and boosting the negative capacitance blocking oxide layer based on the depolarization field and the internal field.

In operation S840, the manufacturing system may form a gate on one surface of the negative capacitance blocking oxide layer.

In the aforementioned manufacturing method, remaining operations S810, S820, and S840 except for operation S830 are identical to corresponding operations of a manufacturing method of a conventional non-volatile memory and thus, further description is omitted here.

Figure 9:
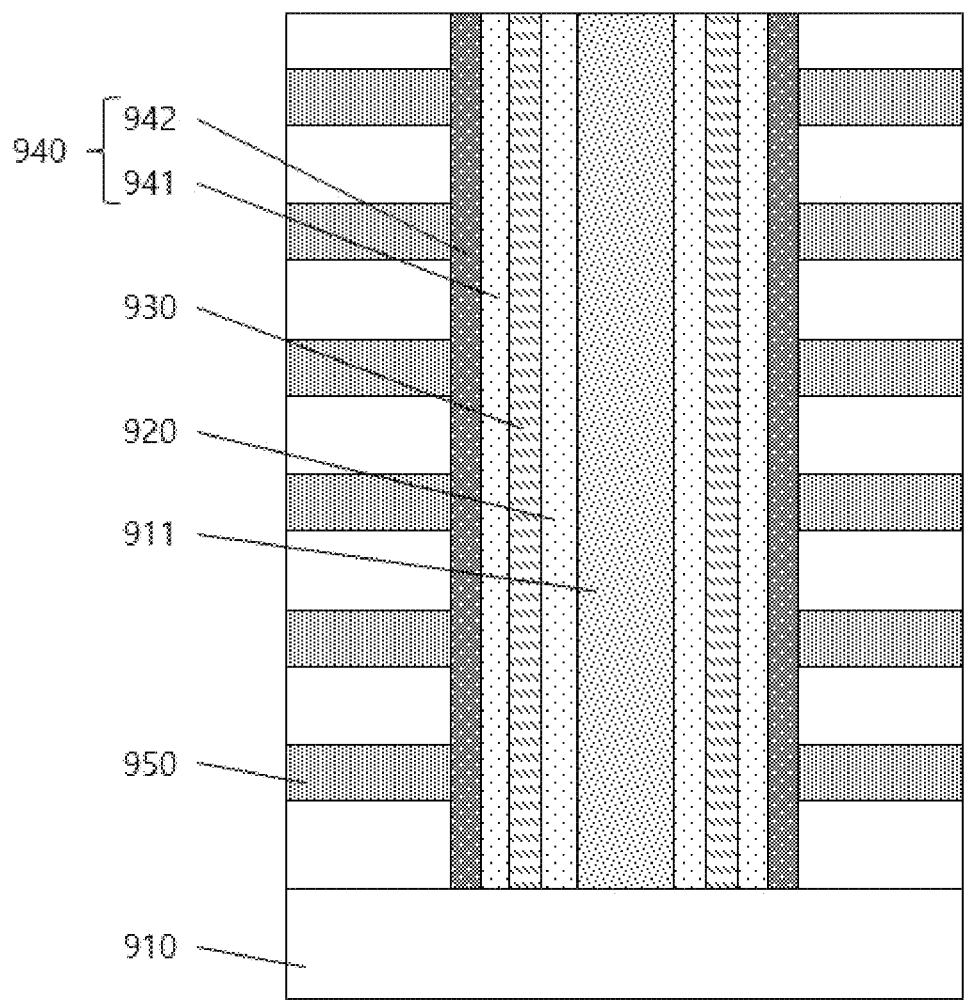
FIG. 9 is a cross-sectional view illustrating a non-volatile memory in a three-dimensional (3D) structure according to an example embodiment.

FIG. 9 is a cross-sectional view illustrating a non-volatile memory in a three-dimensional (3D) structure according to an example embodiment.

Referring to FIG. 9, a non-volatile memory in a 3D structure according to an example embodiment may include a semiconductor substrate 910, a channel 911 formed on a top surface of the semiconductor substrate 910 to extend in a vertical direction, at least one tunneling oxide layer 920 formed to contact the channel 911, at least one charge storage layer 930 formed to contact the at least one tunneling oxide layer 920, at least one negative capacitance blocking oxide layer 940 formed to contact the at least one charge storage layer 930, and a plurality of gates 950 formed to contact the at least one negative capacitance blocking oxide layer 940.

Although each of the at least one tunneling oxide layer 920, the at least one charge storage layer 930, and the at least one negative capacitance blocking oxide layer 940 is illustrated as a structure implemented as a single unit that extends in a vertical direction, similar to the channel 911, there may be provided a structure implemented in pluralities separate from each other, similar to the plurality of gates 950. For example, the at least one tunneling oxide layer 920 may be implemented in plurality to correspond to the plurality of gates 950, the at least one charge storage layer 930 may be implemented in plurality to correspond to the plurality of gates 950, and the at least one negative capacitance blocking oxide layer 940 may be implemented in plurality to correspond to the plurality of gates 950.

The substrate 910 may be a semiconductor substrate, for example, a monocrystalline epitaxial layer grown on a silicon substrate, a silicon-germanium substrate, a germanium substrate, or a monocrystalline silicon substrate.

The channel 911 refers to a component that delivers charge while extending in a vertical direction on the substrate 910 and may be formed of monocrystalline silicon or poly silicon to be boosted by an applied voltage.

The at least one tunneling oxide layer 920 refers to a layer that is in contact with an outer surface of the channel 911 and F-N tunnels charge of the channel 911 to the at least one charge storage layer 930 by an applied electric field, and may be formed of oxide, such as SiO, AlO, and TiO.

The at least one charge storage layer 930 refers to a layer that is in contact with an outer surface of the at least one tunneling oxide layer 920 and serves as a data storage by implementing data values by trapping charge tunneled through the at least one tunneling oxide layer 920 and may be formed of nitride, such as SiN.

The at least one negative capacitance blocking oxide layer 940 refers to a layer that is in contact with an outer surface of the at least one charge storage layer 930 and serves as a shield, and particularly, in an example embodiment, may serve as a shield and also serve to improve operating voltage and operating speed without degrading durability through charging and boosting of charge.

To this end, the at least one negative capacitance blocking oxide layer 940 may have a dual structure in which a dielectric layer 941 and an imprinted polarization layer 942 are sequentially configured on one surface of the at least one charge storage layer 930.

The imprinted polarization layer 942 may be switched only at a voltage of an opposite polarity of an aligned initial polarization since an imprinted ferroelectric layer (Imprinted Ferroelectrics; I-FE) or an imprinted antiferroelectric layer (Imprinted Antiferroelectric; I-AFE) is used to have the initially aligned polarization. Therefore, the imprinted polarization layer 942 may implement a self-rectification function. For example, the imprinted polarization layer 942 may be formed in such a manner that ferroelectric, such as Pb (Zr, Ti) O, is imprinted or may be formed in such a manner that antiferroelectric, such as HfZrO, is imprinted, to have the initially aligned polarization in one direction (e.g., negative direction) such that a polarization may be switched as a positive voltage is applied to a corresponding gate among the plurality of gates 150.

The dielectric layer (Dielectric; DE) 941 may be formed of oxide, such as SiO, AlO, and TiO, to tunnel compensation charge for the switched polarization of the imprinted polarization layer 942.

Each of the plurality of gates 950 refers to a component to which a voltage is applied to generate an electric field in the corresponding tunneling oxide layer 920 and may be formed of a conductive material that includes at least one selected from among a doped semiconductor (e.g., doped silicon, etc.), metal (e.g., tungsten (W), copper (Cu), aluminum (Al) tantalum (Ta), titanium (Ti), molybdenum (Mo), ruthenium (Ru), gold (Au), etc.), and conductive metal nitride (e.g., titanium nitride, tantalum nitride, etc.).

In the at least one negative capacitance blocking oxide layer 940 in the above structure, interfacial charge (or fixed charge) ($\sigma_i$) is present in an interface with the dielectric layer 941 to stabilize the initially aligned polarization ($P_{FE}$) of the imprinted polarization layer 942. When a positive voltage (+V) having a shorter pulse width of less than a preset value (e.g., a pulse width of less than 1 μs) is applied to the corresponding gate among the plurality of gates 950, the initially aligned polarization of the imprinted polarization layer 942 may be switched. On the contrary, since the pulse width of the positive voltage is too short to inject compensation charge ($\Delta\sigma_i$) into the imprinted polarization layer 942, the compensation charge for the switched polarization may be tunneled through the dielectric layer 941 and not injected into the imprinted polarization layer 942. Therefore, interfacial charge (or fixed charge) may be maintained.

In the imprinted polarization layer 942 that is not compensated by the compensation charge, a depolarization field ($E_{dep}$) in an opposite direction to that of an electric field of the initially aligned polarization may be induced as the initially aligned polarization of the imprinted polarization layer 942 is switched. Therefore, the imprinted polarization layer 942 may have a negative capacitance by the depolarization field.

The depolarization field induced in the imprinted polarization layer 942 may destabilize hysteresis of the imprinted polarization layer 942 and an internal field ($E_{int}^{DE}$) in an opposite direction to that of the depolarization field may be additionally induced in the dielectric layer 941 that is in contact with the imprinted polarization layer 942.

Therefore, the at least one negative capacitance blocking oxide layer 940 may have a greater capacitance value than an external field based on the depolarization field of the imprinted polarization layer 942 and the internal field of the dielectric layer 941 and may be charged and boosted.

As described above, as the at least one negative capacitance blocking oxide layer 940 has a capacitance based on the depolarization field of the imprinted polarization layer 942 and the internal field of the dielectric layer 941, the electric field applied to the at least one tunneling oxide layer 920 may be applied and the non-volatile memory in the 3D structure may achieve technical effects of improving operating voltage and operating speed without degrading durability. For example, referring to FIG. 5, the non-volatile memory in the aforementioned structure may improve all of the operating voltage and the operating speed compared to the non-volatile memory in the existing structure.

Hereinafter, an operating method and a manufacturing method of the non-volatile memory in the aforementioned 3D structure are described.

Figure 10:
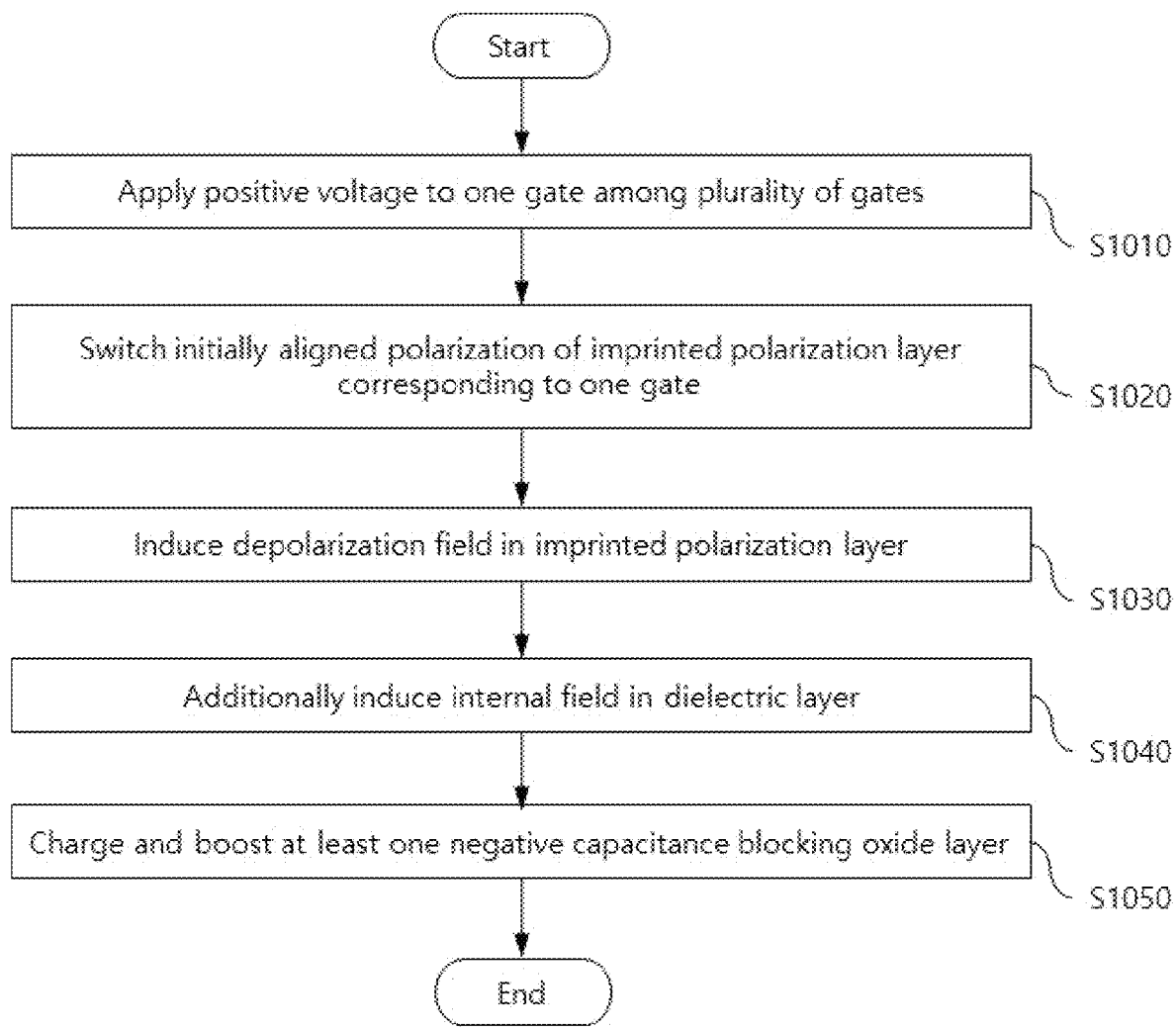
FIG. 10 is a flowchart illustrating an operating method of the non-volatile memory in the 3D structure of FIG. 9.

FIG. 10 is a flowchart illustrating an operating method of the non-volatile memory in the 3D structure of FIG. 9.

FIG. 10 is a flowchart illustrating an operating method of the non-volatile memory of FIG. 9. In the following operating method, the non-volatile memory in the 3D structure described above with reference to FIG. 9 operates as a main entity and a program operation among memory operations is described. However, since a process of charging and boosting the at least one negative capacitance blocking oxide layer 940 may be included in other memory operations except for the program operation, the following operating method may also apply to a read operation and an erase operation without being limited to the program operation.

In operation S1010, the non-volatile memory in the 3D structure may apply a positive voltage to one gate among a plurality of gates.

In operation S1020, the non-volatile memory in the 3D structure may switch an initially aligned polarization of an imprinted polarization layer corresponding to the one gate in response to the positive voltage being applied to the one gate.

Here, the imprinted polarization layer may be formed to have the initially aligned polarization in one direction to switch a polarization as the positive voltage is applied to the one gate. For example, one of an imprinted ferroelectric layer (Imprinted Ferroelectrics; I-FE) and an imprinted antiferroelectric layer (Imprinted Antiferroelectric; I-AFE) may be used as the imprinted polarization layer.

Here, the positive voltage applied to the gate may have a short pulse width to prevent compensation charge of the switched polarization from being injected into the imprinted polarization layer. For example, the positive voltage applied to the gate may have a pulse width of less than 1 μs.

In operation S1030, the non-volatile memory in the 3D structure may induce a depolarization field that is in a direction opposite to that of an electric field of the switched polarization in the imprinted polarization layer as the initially aligned polarization of the imprinted polarization layer is switched.

As described above, since the pulse width of the positive voltage is too short to inject the compensation charge into the imprinted polarization layer, the compensation charge for the switched polarization may not be injected into the imprinted polarization layer and accordingly, interfacial charge may be maintained. In the imprinted polarization layer not compensated by the compensation charge, a depolarization field according to switching of the initially aligned polarization may be induced. Therefore, the imprinted polarization layer may have a negative capacitance by the depolarization field.

In operation S1040, the non-volatile memory in the 3D structure may additionally induce an internal field that is in a direction opposite to that of the depolarization field in the dielectric layer by the depolarization field of the imprinted polarization layer.

In operation S1050, the non-volatile memory in the 3D structure may charge and boost the at least one negative capacitance blocking oxide layer based on the depolarization field of the imprinted polarization layer and the internal field of the dielectric layer.

In detail, as the depolarization field of the imprinted polarization layer is induced in operation S1030 and the internal field of the dielectric layer is additionally induced in operation S1040, the at least one negative capacitance blocking oxide layer may have a greater capacitance value than an external field based on the depolarization field of the imprinted polarization layer and the internal field of the dielectric layer and be charged and boosted accordingly in operation S1050.

As the at least one negative capacitance blocking oxide layer is charged and boosted (as the at least one negative capacitance blocking oxide layer has a capacitance based on the depolarization field of the imprinted polarization layer and the internal field of the dielectric layer) in operation S1050, the non-volatile memory in the 3D structure may amplify the electric field that is being applied to the at least one tunneling oxide layer. Therefore, operating voltage and operating speed may be improved without degrading the durability.

FIG. 11 is a flowchart illustrating a manufacturing method of the non-volatile memory in the 3D structure of FIG. 9. The following manufacturing method relates to manufacturing the non-volatile memory in the 3D structure described above with reference to FIG. 9 and may be premised on being performed by an automated and mechanized manufacturing system.

In operation S1110, the manufacturing system may form a channel to extend in a vertical direction.

In operation S1120, the manufacturing system may form at least one tunneling oxide layer to contact the channel.

In operation S1130, the manufacturing system may form at least one charge storage layer on one surface of the at least one tunneling oxide layer.

In operation S1140, the manufacturing system may form at least one negative capacitance blocking oxide layer by sequentially configuring a dielectric layer and an imprinted polarization layer to contact the at least one charge storage layer.

Here, in operation S1140, the manufacturing system may form the imprinted polarization layer having the initially aligned polarization in one direction to switch a polarization of an imprinted polarization layer corresponding to the one gate as the positive voltage is applied to one gate among the plurality of gates.

Therefore, when the positive voltage is applied to the at least one negative capacitance blocking oxide layer through the one gate among the plurality of gates, the manufactured non-volatile memory in the 3D structure may improve operating voltage and operating speed by allowing a corresponding imprinted polarization layer to have a negative capacitance by an induced depolarization field, by additionally inducing an internal field by the depolarization field of the imprinted polarization layer in the dielectric layer, and by charging and boosting the at least one negative capacitance blocking oxide layer based on the depolarization field and the internal field.

In operation S1150, the manufacturing system may form the plurality of gates on one surface of the at least one negative capacitance blocking oxide layer.

In the aforementioned manufacturing method, remaining operations S1110, S1120, S1130, and S1150 except for operation S1140 are identical to corresponding operations of a manufacturing method of a conventional non-volatile memory and thus, further description is omitted here.

Also, although it is described that operations S1110 to S1150 of the aforementioned manufacturing method are sequentially performed from operation S1110 to operation S1150 for clarity of description, the manufacturing method may be substantially performed in reverse order from operation S1150 to operation S1110.

For example, the manufacturing method of the non-volatile memory in the 3D structure may be performed through operation 1 of preparing a semiconductor structure in which a plurality of gates and interlayer insulating layers are alternately stacked, operation 2 of forming a channel hole to extend in a vertical direction in the semiconductor structure, operation 3 of forming at least one negative capacitance blocking oxide layer by sequentially configuring an imprinted polarization layer and a dielectric layer within the channel hole, operation 4 of forming at least one charge storage layer in an internal hole of the at least one negative capacitance blocking oxide layer to contact the dielectric layer, operation 5 of forming at least one tunneling oxide layer in the internal hole of the at least one charge storage layer, and operation 6 of forming the channel to extend in the internal hole of the at least one tunneling oxide layer. In this case, operation S1110 may correspond to operation 6, operation S1120 may correspond to operation 5, operation S1130 may correspond to operation 4, operation S1140 may correspond to operation 3, and operation S1150 may correspond to operation 1.

The aforementioned manufacturing method refers to a gate first method of initially forming a gate. A method of using a sacrificial layer may be performed in a similar manner and may correspond to the aforementioned operations S1110 to S1150. For example, the manufacturing method of the non-volatile memory in the 3D structure may be performed through operation 1 of preparing a semiconductor structure in which a plurality of sacrificial layers and interlayer insulating layers are alternately stacked, operation 2 of forming a channel hole to extend in a vertical direction in the semiconductor structure, operation 3 of forming at least one negative capacitance blocking oxide layer by sequentially configuring an imprinted polarization layer and a dielectric layer within the channel hole, operation 4 of forming at least one charge storage layer in an internal hole of the at least one negative capacitance blocking oxide layer to contact the dielectric layer, operation 5 of forming at least one tunneling oxide layer in the internal hole of the at least one charge storage layer, operation 6 of forming the channel to extend in the internal hole of the at least one tunneling oxide layer, and operation 7 of removing the plurality of sacrificial layers and forming a plurality of gates in spaces in which the plurality of sacrificial layers are removed. In this case, operation S1110 may correspond to operation 6, operation S1120 may correspond to operation 5, operation S1130 may correspond to operation 4, operation S1140 may correspond to operation 3, and operation S1150 may correspond to operation 7.

While this disclosure includes specific example embodiments, it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile memory comprising:
a tunneling oxide layer formed on a channel;
a charge storage layer formed on one surface of the tunneling oxide layer;
a negative capacitance blocking oxide layer in which a dielectric layer and an imprinted polarization layer are sequentially configured on one surface of the charge storage layer; and
a gate formed on one surface of the negative capacitance blocking oxide layer;
wherein the imprinted polarization layer has a negative capacitance by a depolarization field induced as an initially aligned polarization is switched in response to a positive voltage being applied to the gate, the depolarization field being in a direction opposite to that of an electric field of the switched polarization.

2. The non-volatile memory of claim 1, wherein the negative capacitance blocking oxide layer has a capacitance based on an internal field additionally induced in the dielectric layer by the depolarization field of the imprinted polarization layer and the depolarization field of the imprinted polarization layer, the internal field being in a direction opposite to that of the depolarization field.

3. The non-volatile memory of claim 2, wherein an electric field applied to the tunneling oxide layer is amplified as the negative capacitance blocking oxide layer has a capacitance based on the internal field of the dielectric layer and the depolarization field of the imprinted polarization layer.

4. The non-volatile memory of claim 1, wherein the positive voltage applied to the gate has a short pulse width that prevents compensation charge of the switched polarization from being injected into the imprinted polarization layer.

5. The non-volatile memory of claim 1, wherein an imprinted ferroelectric layer or an imprinted antiferroelectric layer is used as the imprinted polarization layer.

6. The non-volatile memory of claim 1, wherein the imprinted polarization layer has an initially aligned polarization in one direction to switch a polarization as a positive voltage is applied to the gate.

7. An operating method of a non-volatile memory comprising a tunneling oxide layer formed on a channel; a charge storage layer formed on one surface of the tunneling oxide layer; a negative capacitance blocking oxide layer in which a dielectric layer and an imprinted polarization layer are sequentially configured on one surface of the charge storage layer; and a gate formed on one surface of the negative capacitance blocking oxide layer, the operating method comprising:
applying a positive voltage to the gate;
switching an initially aligned polarization of the imprinted polarization layer in response to the positive voltage being applied to the gate;
inducing a depolarization field that is in a direction opposite to that of an electric field of the switched polarization in the imprinted polarization layer as the initially aligned polarization of the imprinted polarization layer is switched;
additionally inducing an internal field that is in a direction opposite to that of the depolarization field in the dielectric layer by the depolarization field of the imprinted polarization layer; and
charging and boosting the negative capacitance blocking oxide layer based on the depolarization field of the imprinted polarization layer and the internal field of the dielectric layer.

8. The operating method of claim 7, wherein the charging and the boosting comprises:
amplifying an electric field applied to the tunneling oxide layer as the negative capacitance blocking oxide layer has a capacitance based on the depolarization field of the imprinted polarization layer and the internal field of the dielectric layer.

9. A non-volatile memory in a three-dimensional (3D) structure, the non-volatile memory comprising:
a channel formed to extend in a vertical direction;
at least one tunneling oxide layer formed to contact the channel;
at least one charge storage layer formed to contact the at least one tunneling oxide layer;
at least one negative capacitance blocking oxide layer in which a dielectric layer and an imprinted polarization layer are sequentially configured to contact the at least one charge storage layer; and
a plurality of gates formed to contact the at least one negative capacitance blocking oxide layer;
wherein the imprinted polarization layer has a negative capacitance by a depolarization field induced as an initially aligned polarization is switched in response to a positive voltage being applied to the plurality of gates, the depolarization field being in a direction opposite to that of an electric field of the switched polarization.

10. The non-volatile memory of claim 9, wherein the at least one negative capacitance blocking oxide layer has a capacitance based on an internal field additionally induced in the dielectric layer by the depolarization field of the imprinted polarization layer and the depolarization field of the imprinted polarization layer, the internal field being in a direction opposite to that of the depolarization field.

11. The non-volatile memory of claim 10, wherein an electric field applied to the tunneling oxide layer is amplified as the at least one negative capacitance blocking oxide layer has a capacitance based on the internal field of the dielectric layer and the depolarization field of the imprinted polarization layer.

12. The non-volatile memory of claim 9, wherein an imprinted ferroelectric layer or an imprinted antiferroelectric layer is used as the imprinted polarization layer.

13. An operating method of a non-volatile memory in a three-dimensional (3D) structure comprising a channel formed to extend in a vertical direction; at least one tunneling oxide layer formed to contact the channel; at least one charge storage layer formed to contact the at least one tunneling oxide layer; at least one negative capacitance blocking oxide layer in which a dielectric layer and an imprinted polarization layer are sequentially configured to contact the at least one charge storage layer; and a plurality of gates formed to contact the at least one negative capacitance blocking oxide layer, the operating method comprising:

applying a positive voltage to one gate among the plurality of gates;

switching an initially aligned polarization of the imprinted polarization layer corresponding to the one gate in response to the positive voltage being applied to the one gate;

inducing a depolarization field that is in a direction opposite to that of an electric field of the switched polarization in the imprinted polarization layer as the initially aligned polarization of the imprinted polarization layer is switched;

additionally inducing an internal field that is in a direction opposite to that of the depolarization field in the dielectric layer by the depolarization field of the imprinted polarization layer; and charging and boosting the at least one negative capacitance blocking oxide layer based on the depolarization field of the imprinted polarization layer and the internal field of the dielectric layer.

14. The operating method of claim 13, wherein the charging and the boosting comprises amplifying an electric field applied to the at least one tunneling oxide layer as the at least one negative capacitance blocking oxide layer has a capacitance based on the depolarization field of the imprinted polarization layer and the internal field of the dielectric layer.

* * * * *